(12) United States Patent
Zhou

(10) Patent No.: US 12,532,708 B2
(45) Date of Patent: Jan. 20, 2026

(54) METHODS FOR FUSION BONDING SEMICONDUCTOR DEVICES TO TEMPORARY CARRIER WAFERS WITH HYDROPHOBIC REGIONS FOR REDUCED BOND STRENGTH, AND SEMICONDUCTOR DEVICE ASSEMBLIES FORMED BY THE SAME

(71) Applicant: Micron Technology, Inc., Boise, ID (US)

(72) Inventor: Wei Zhou, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 655 days.

(21) Appl. No.: 17/882,399

(22) Filed: Aug. 5, 2022

(65) Prior Publication Data

US 2024/0047260 A1    Feb. 8, 2024

(51) Int. Cl.
*H01L 25/065*     (2023.01)
*H01L 21/56*      (2006.01)
(Continued)

(52) U.S. Cl.
CPC ........ *H01L 21/6835* (2013.01); *H01L 21/568* (2013.01); *H01L 23/3171* (2013.01); *H01L 24/05* (2013.01); *H01L 24/06* (2013.01); *H01L 24/08* (2013.01); *H01L 24/11* (2013.01); *H01L 24/80* (2013.01); *H01L 25/0657* (2013.01); *H01L 23/29* (2013.01); *H01L 23/291* (2013.01); *H01L 24/13* (2013.01); *H01L 2221/68318* (2013.01); *H01L 2221/68368* (2013.01); *H01L 2221/68386* (2013.01);
(Continued)

(58) Field of Classification Search
CPC .............. H01L 21/6835; H01L 21/568; H01L 23/3171; H01L 24/06; H01L 2224/86895–86897; H01L 2224/80894–80896; H01L 2224/81894–81896; H01L 2224/82895–82897; H01L 2224/84895–84897; H01L 2224/8583; H01L 2224/85895–85898; H01L 24/05; H01L 24/08; H01L 24/11; H01L 24/80; H01L 25/0657
See application file for complete search history.

(56) References Cited

U.S. PATENT DOCUMENTS

2024/0038718 A1*   2/2024   Hung ................... H01L 24/96

* cited by examiner

*Primary Examiner* — Suberr L Chi
(74) *Attorney, Agent, or Firm* — Dorsey & Whitney LLP

(57) ABSTRACT

Methods of making a semiconductor device assembly are provided. The methods can comprise providing a first semiconductor device having a first dielectric material at a first surface, providing a carrier wafer having a second dielectric material at a second surface, and forming a dielectric-dielectric bond between the first dielectric material and the second dielectric material. At least one of the first surface and the second surface includes a region of hydrophobic material electrically isolated from any circuitry of the first semiconductor device and configured to have a reduced bonding strength to a facing region relative to the dielectric-dielectric bond. The method can further include stacking one or more second semiconductor devices over the first semiconductor device to form the semiconductor device assembly, and removing the semiconductor device assembly from the carrier wafer.

13 Claims, 11 Drawing Sheets

(51) Int. Cl.
H01L 21/683 (2006.01)
H01L 23/00 (2006.01)
H01L 23/31 (2006.01)
H01L 23/29 (2006.01)

(52) U.S. Cl.
CPC ................ *H01L 2224/0557* (2013.01); *H01L 2224/05571* (2013.01); *H01L 2224/05573* (2013.01); *H01L 2224/06136* (2013.01); *H01L 2224/06181* (2013.01); *H01L 2224/08145* (2013.01); *H01L 2224/11002* (2013.01); *H01L 2224/13023* (2013.01); *H01L 2224/80006* (2013.01); *H01L 2224/80379* (2013.01); *H01L 2225/06541* (2013.01); *H01L 2225/06565* (2013.01)

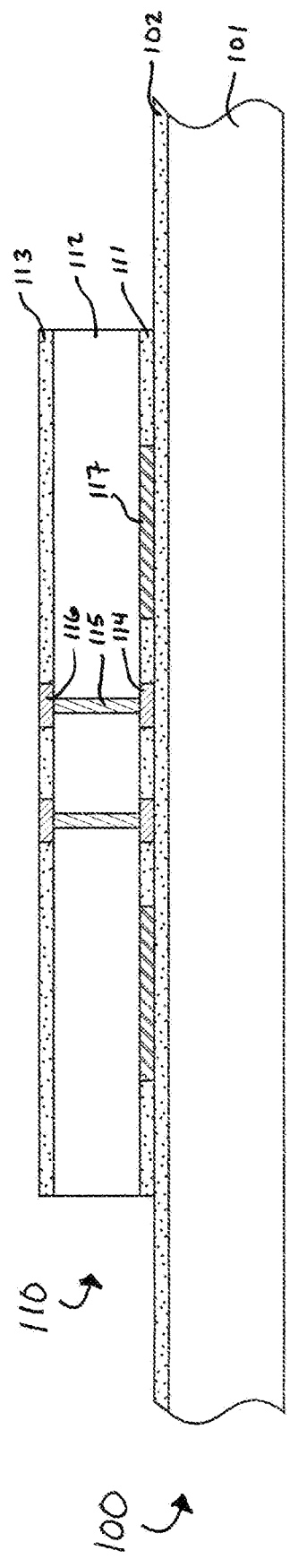
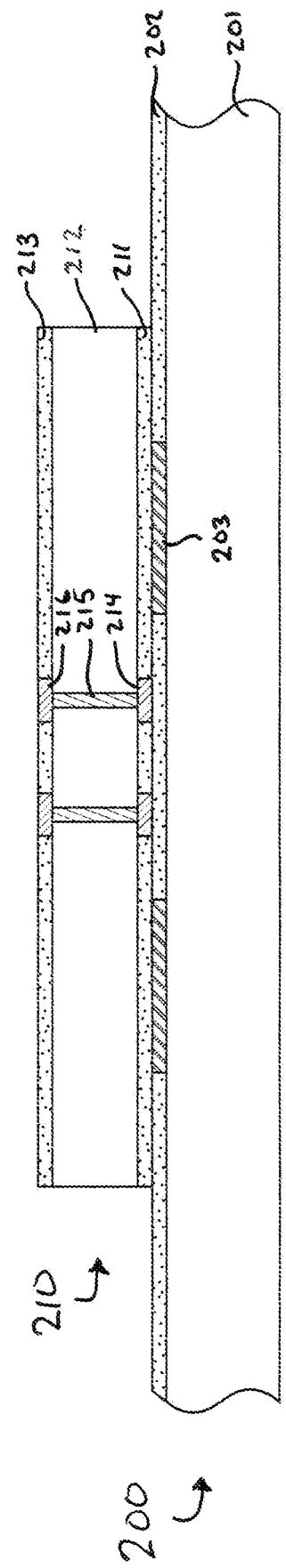

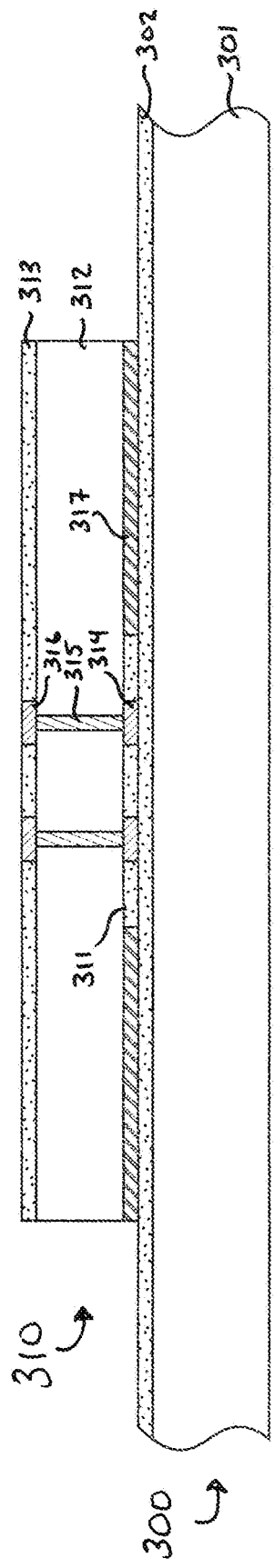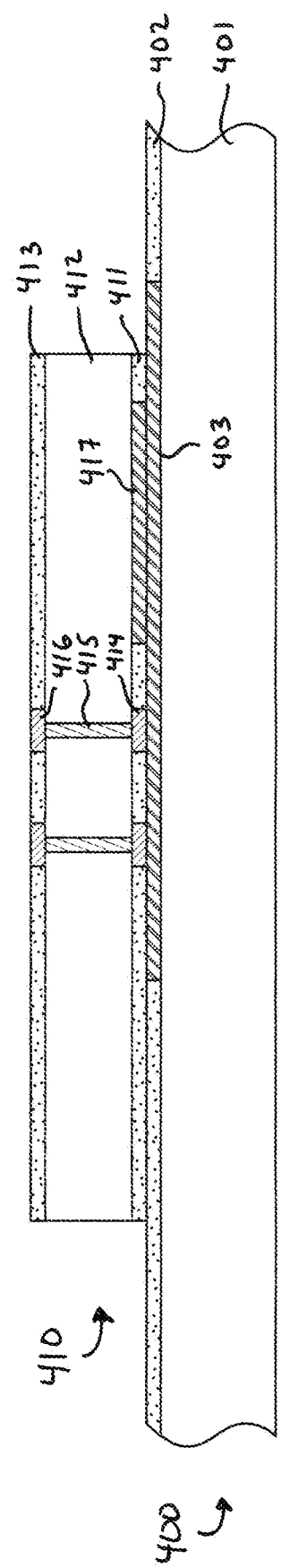

METHODS FOR FUSION BONDING SEMICONDUCTOR DEVICES TO TEMPORARY CARRIER WAFERS WITH HYDROPHOBIC REGIONS FOR REDUCED BOND STRENGTH, AND SEMICONDUCTOR DEVICE ASSEMBLIES FORMED BY THE SAME

TECHNICAL FIELD

The present disclosure generally relates to semiconductor device assemblies, and more particularly relates to methods for fusion bonding semiconductor devices to temporary carrier wafers with hydrophobic regions for reduced bond strength, and semiconductor device assemblies formed by the same.

BACKGROUND

Microelectronic devices generally have a die (i.e., a chip) that includes integrated circuitry with a high density of very small components. Typically, dies include an array of very small bond pads electrically coupled to the integrated circuitry. The bond pads are external electrical contacts through which the supply voltage, signals, etc., are transmitted to and from the integrated circuitry. After dies are formed, they are "packaged" to couple the bond pads to a larger array of electrical terminals that can be more easily coupled to the various power supply lines, signal lines, and ground lines. Conventional processes for packaging dies include electrically coupling the bond pads on the dies to an array of leads, ball pads, or other types of electrical terminals, and encapsulating the dies to protect them from environmental factors (e.g., moisture, particulates, static electricity, and physical impact).

BRIEF DESCRIPTION OF THE DRAWINGS

FIGS. 1 through 4 are simplified schematic cross-sectional views of a semiconductor device attached to a carrier wafer in accordance with embodiments of the present technology.

DETAILED DESCRIPTION

Figure 5:
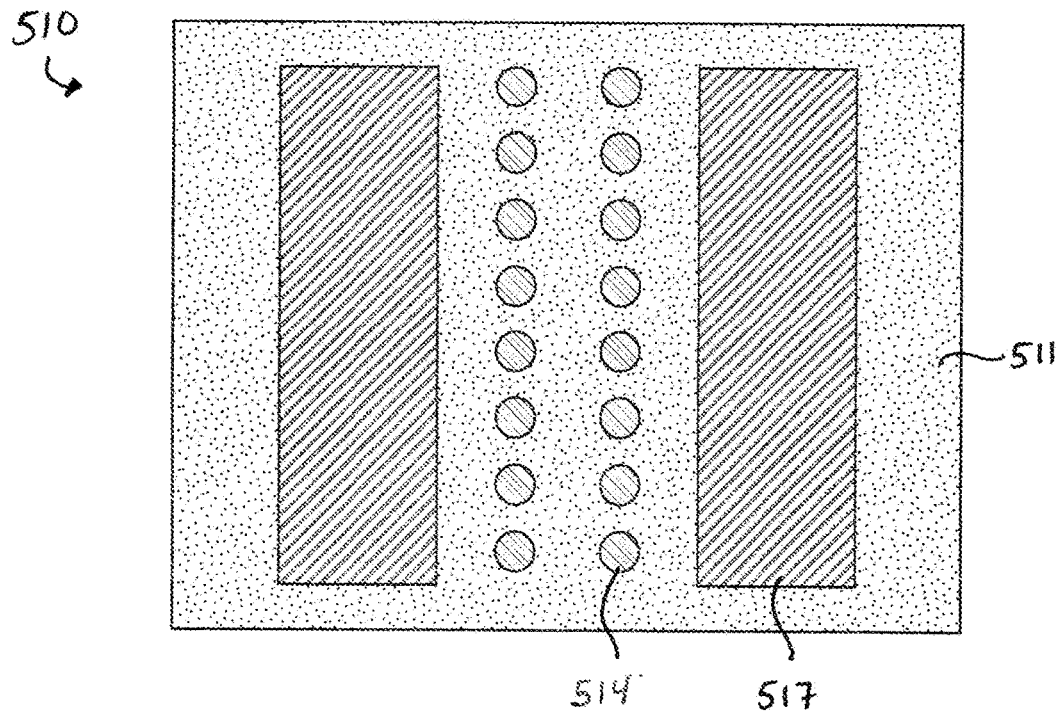
FIGS. 5 and 6 are simplified schematic plan views of a semiconductor device in accordance with embodiments of the present technology.

The formation of many semiconductor device assemblies can involve temporarily bonding a chip to a carrier wafer (C2W) to enable wafer-level processing steps to be performed on semiconductor devices already singulated from another wafer (e.g., "known good die" (KGD)). One challenge with temporarily bonding a semiconductor device is balancing the strength of the bond with the ease of subsequent removal. A bond that is too strong (e.g., a "fusion" or dielectric-dielectric bond between large facing regions of passivation material on surfaces of both the die and the carrier wafer) can interfere with removal of the die from the carrier wafer, potentially causing damage to the die, the carrier wafer, or both. A bond that is insufficiently strong (e.g., a temporary adhesive) can permit movement of the semiconductor device relative to the carrier wafer, potentially causing alignment issues or other processing challenges that can reduce yield. Moreover, adhesives can require subsequent cleaning steps that present their own challenges—cost, tooling compatibility, etc.

To address these drawbacks and others, various embodiments of the present application provide improved approaches for temporarily bonding a semiconductor device to a carrier wafer. In this regard, embodiment of the present disclosure provide a method in which a dielectric-dielectric bond is formed between a first dielectric material at a first surface of a semiconductor device and a second dielectric material at a second surface of a carrier wafer, wherein at least one of the first surface and the second surface including a region of hydrophobic material electrically isolated from any circuitry of the semiconductor device and configured to have a reduced bonding strength to a facing region relative to the dielectric-dielectric bond. The region of hydrophobic material may be provided at the first surface of the semiconductor device, at the second surface of the carrier wafer, or both. The region of hydrophobic material reduces the area of the dielectric-dielectric bond between the semiconductor device and the carrier wafer, thereby reducing the force necessary to separate them.

FIG. 1 is a simplified schematic cross-sectional view of a semiconductor device 110 attached to a carrier wafer 100 in accordance with embodiments of the present technology. As can be seen with reference to FIG. 1, the carrier wafer 100 includes a substrate 101 (e.g., silicon, glass, alumina, etc.) on which is formed a layer of dielectric material (e.g., SiO, $SiO_2$, SiN, SiCN, SiON, etc.). The semiconductor device 110 includes a substrate 112 (e.g., silicon) with dielectric layers 111 and 113 on opposing surfaces thereof. The semiconductor device 110 can further include contact pads 114 and 116 on opposing surfaces thereof, coupled by through-silicon vias 115, to facilitate stacking the semiconductor device 110 into an assembly with other similar devices. The semiconductor device 110 further includes one or more regions 117 of hydrophobic material (e.g., a metal such as Cu, Al, Au, Co, Ru, W or the like) at the surface facing the carrier wafer 100. While the dielectric layer 111 of the semiconductor device 110 and the dielectric layer 102 of the carrier wafer 100 are bonded together with a relatively strong dielectric-dielectric bond, the regions 117 of hydrophobic material do not form such a bond with the facing dielectric material, and accordingly reduce the strength of the bond between the semiconductor device 110 and the carrier wafer.

In accordance with one aspect of the present disclosure the regions 117 of hydrophobic material are electrically isolated from any circuits in the semiconductor device 110 (and therefore from any circuits in a semiconductor device assembly into which the semiconductor device 110 is incorporated). In other embodiments, the regions 117 of hydrophobic material may be coupled to one or more circuits of the semiconductor device 110 (e.g., to a ground plane, a power plane, or to a signaling circuit).

Although in the foregoing example embodiment, the regions 117 of hydrophobic material are illustrated and described as being formed at a surface of the semiconductor device 110, in other embodiments a carrier wafer may instead include similar regions. One such arrangement is shown in FIG. 2, in which a simplified schematic cross-sectional view of a semiconductor device 210 attached to a carrier wafer 200 is illustrated in accordance with embodiments of the present technology.

As can be seen with reference to FIG. 2, the carrier wafer 200 includes a substrate 201 (e.g., silicon, glass, alumina, etc.) on which is formed a layer of dielectric material (e.g., SiO, SiO$_2$, SiN, etc.). The semiconductor device 210 includes a substrate 212 (e.g., silicon) with dielectric layers 211 and 213 on opposing surfaces thereof. The semiconductor device 210 can further include contact pads 214 and 216 on opposing surfaces thereof, coupled by through-silicon vias 215, to facilitate stacking the semiconductor device 210 into an assembly with other similar devices. The carrier wafer 200 further includes one or more regions 203 of hydrophobic material (e.g., a metal such as Cu, Al, Au, or the like) at the surface facing the semiconductor device 210. While the dielectric layer 211 of the semiconductor device 210 and the dielectric layer 202 of the carrier wafer 200 are bonded together with a relatively strong dielectric-dielectric bond, the regions 203 of hydrophobic material do not form such a bond with the facing dielectric material, and accordingly reduce the strength of the bond between the semiconductor device 210 and the carrier wafer.

According to one aspect of the present disclosure, the relative area of the regions of hydrophobic material to areas where a dielectric bond is formed (e.g., in a non-contact area excluding the area of any metal contact pads facing the carrier wafer) may be selected based on a desired bond strength between a semiconductor die and a carrier wafer. For example, in various embodiments, the non-contact area (e.g., the area of the footprint of the semiconductor device exclusive of the area of the contact pads of the semiconductor device) may comprise more than 25% hydrophobic material, more than 33% hydrophobic material, more than 50% hydrophobic material, or even more than 67% hydrophobic material. According to another aspect of the present disclosure, not only the area of the hydrophobic material, but its location relative to one or more edges of the semiconductor device, may also be selected to optimize a ratio between bond strength and ease of removal.

For example, FIG. 3 is a simplified schematic cross-sectional view of a semiconductor device 310 attached to a carrier wafer 300 in accordance with embodiments of the present technology. As can be seen with reference to FIG. 3, the carrier wafer 300 includes a substrate 301 (e.g., silicon, glass, alumina, etc.) on which is formed a layer of dielectric material (e.g., SiO, SiO$_2$, SiN, etc.). The semiconductor device 310 includes a substrate 312 (e.g., silicon) with dielectric layers 311 and 313 on opposing surfaces thereof. The semiconductor device 310 can further include contact pads 314 and 316 on opposing surfaces thereof, coupled by through-silicon vias 315, to facilitate stacking the semiconductor device 310 into an assembly with other similar devices. The semiconductor device 310 further includes one or more regions 317 of hydrophobic material (e.g., a metal such as Cu, Al, Au, or the like) at the surface facing the carrier wafer 300. While the dielectric layer 311 of the semiconductor device 310 and the dielectric layer 302 of the carrier wafer 300 are bonded together with a relatively strong dielectric-dielectric bond, the regions 317 of hydrophobic material do not form such a bond with the facing dielectric material, and accordingly reduce the strength of the bond between the semiconductor device 310 and the carrier wafer. Unlike the regions 117 of hydrophobic material in the example semiconductor device 110 of FIG. 1, the regions 317 in the example semiconductor device 310 of FIG. 3 extend all the way to opposing sidewalls of the semiconductor device 310. With the regions 317 adjacent a sidewall of the semiconductor device 310, it can be easier to begin a de-bonding operation by a lifting an edge of the device at which the hydrophobic material provides a reduced bonding strength relative to the bond between facing dielectric materials between the semiconductor device 310 and the carrier wafer 300.

Although in the foregoing example embodiments, regions of hydrophobic material have been illustrated and described as being formed either at a surface of a semiconductor device, or at a surface of a carrier wafer, in other embodiments both a semiconductor device and a carrier wafer may include such regions. One such arrangement is shown in FIG. 4, in which a simplified schematic cross-sectional view of a semiconductor device 410 attached to a carrier wafer 400 is illustrated in accordance with embodiments of the present technology.

As can be seen with reference to FIG. 4, the carrier wafer 400 includes a substrate 401 (e.g., silicon, glass, alumina, etc.) on which is formed a layer of dielectric material (e.g., SiO, SiO$_2$, SiN, etc.). The semiconductor device 410 includes a substrate 412 (e.g., silicon) with dielectric layers 411 and 413 on opposing surfaces thereof. The semiconductor device 410 can further include contact pads 414 and 416 on opposing surfaces thereof, coupled by through-silicon vias 415, to facilitate stacking the semiconductor device 410 into an assembly with other similar devices. The semiconductor device 410 further includes one or more regions 417 of hydrophobic material (e.g., a metal such as Cu, Al, Au, or the like) at the surface facing the carrier wafer 400, which also includes one or more regions 403 of hydrophobic material (e.g., a metal such as Cu, Al, Au, or the like) at the surface facing the semiconductor device 410. While the dielectric layer 411 of the semiconductor device 410 and the dielectric layer 402 of the carrier wafer 400 are bonded together with a relatively strong dielectric-dielectric bond, the regions 417 of hydrophobic material do not form such a bond with the facing dielectric material, and accordingly reduce the strength of the bond between the semiconductor device 410 and the carrier wafer. Unlike the regions 203 of hydrophobic material in the example carrier wafer 200 of FIG. 2, the regions 403 in the example carrier wafer 400 of FIG. 4 overlap a sidewall of the semiconductor device 410. With the regions 403 overlapping a sidewall of the semiconductor device 410, it can be easier to begin a de-bonding operation by a lifting an edge of the device at which the hydrophobic material provides a reduced bonding strength relative to the bond between facing dielectric materials between the semiconductor device 410 and the carrier wafer 400.

Figure 6:
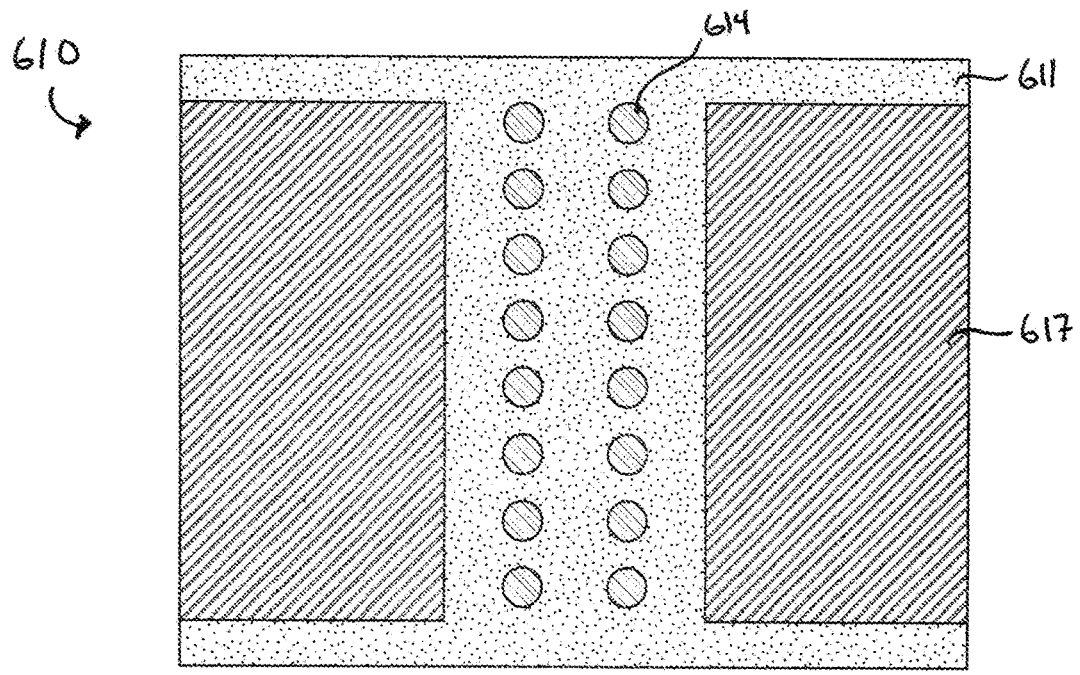
Figure 7:
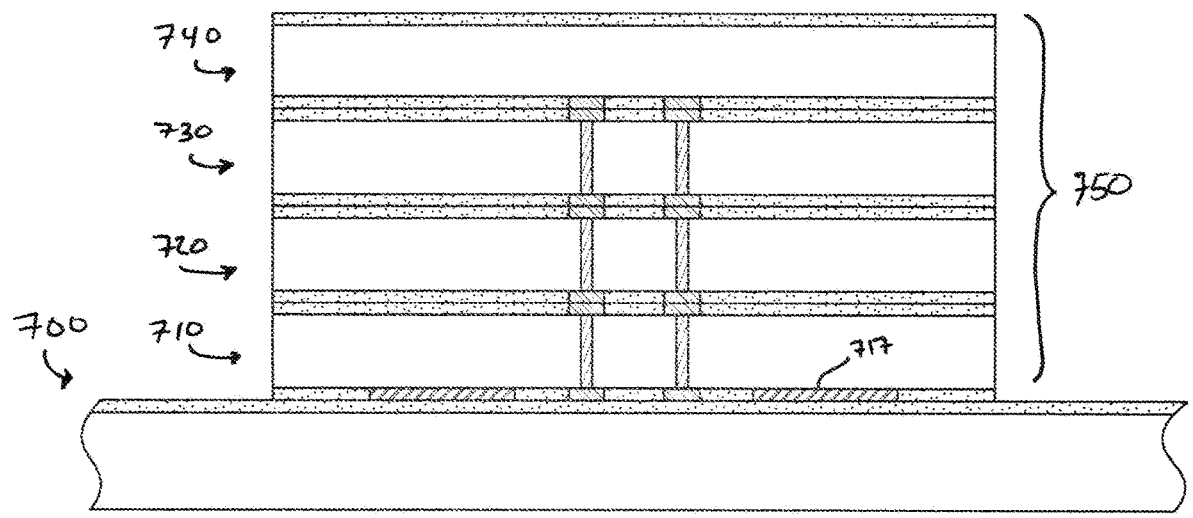
FIGS. 7 through 15 are simplified schematic cross-sectional views of semiconductor device assemblies in various stages of manufacturing in accordance with embodiments of the present technology.

FIGS. 5 and 6 are simplified schematic plan views of a semiconductor device in accordance with embodiments of the present technology, illustrating the relative arrangement of regions of hydrophobic material, dielectric material configured to form a dielectric bond with a carrier wafer, and metal interconnects. Turning to FIG. 5, a plan view of a semiconductor device 510, similar to the semiconductor device 110 of FIG. 1, is illustrated in accordance with one embodiment of the present disclosure. The illustrated surface of semiconductor device 510 includes a dielectric layer 511 surrounding contact pads 514 (e.g., whose cumulative area may be referred to as the "contact area", such that the remaining area of the footprint of the semiconductor device 510 is referred to as the "non-contact area"), and one or more regions 517 of hydrophobic material (e.g., a metal such as Cu, Al, Au, or the like). The ratio of the area of the regions 517 of hydrophobic material to the non-contact area is about 33% in the illustrated example, corresponding to about a 33% reduction in the strength of the dielectric-dielectric bond that would be formed by semiconductor device 510 with the dielectric surface of a carrier wafer like carrier wafer 100 of FIG. 1, relative to a semiconductor device that did not include such regions 517 of hydrophobic material.

Turning to FIG. 6, a plan view of a semiconductor device 610, similar to the semiconductor device 310 of FIG. 3, is illustrated in accordance with one embodiment of the present disclosure. The illustrated surface of semiconductor device 610 includes a dielectric layer 611 surrounding contact pads 614 (e.g., whose cumulative area may be referred to as the "contact area", such that the remaining area of the footprint of the semiconductor device 610 is referred to as the "non-contact area"), and one or more regions 617 of hydrophobic material (e.g., a metal such as Cu, Al, Au, or the like). The ratio of the area of the regions 617 of hydrophobic material to the non-contact area is about 60% in the illustrated example. Moreover, the regions 617 extend to opposing sidewalls of the semiconductor device 610, such that bond strength is both reduced by about 60% (relative to a semiconductor device that did not include such regions 617 of hydrophobic material), and a de-bonding operation can be facilitated by the ease of initiating the de-bonding from an edge of the semiconductor device 610. Although the regions 617 of hydrophobic material are illustrated and described in the present example as extending to a single sidewall each, in other embodiments regions of hydrophobic material can extend to more than one sidewall (e.g., two, three, or even four).

Figure 8:
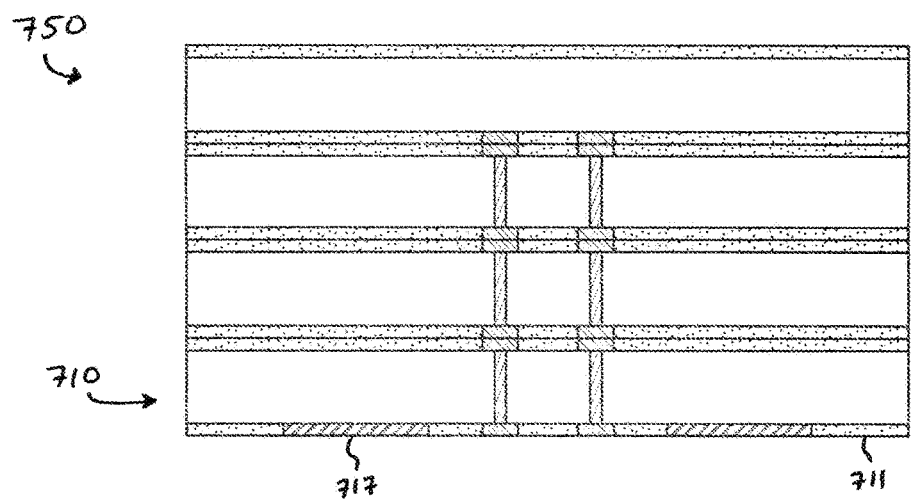

According to various aspects of the present disclosure, the controllable strength of the bond between a carrier wafer and a semiconductor device provided by the foregoing approaches can facilitate the manufacture of semiconductor device assemblies. For example, FIGS. 7 through 15 provide simplified schematic cross-sectional views of semiconductor device assemblies in various stages of manufacturing in accordance with embodiments of the present technology. As can be seen with reference to FIG. 7, following the bonding of a semiconductor device 710 to a carrier wafer 700, with a bond strength mediated by one or more regions 717 of hydrophobic material at the surface of the semiconductor device 710 (and/or at the surface of the carrier wafer 700), additional semiconductor devices 720, 730, and 740 can be stacked over (e.g., with hybrid bonding, where facing dielectric layers of each pair of devices form a dielectric-dielectric bond, and facing interconnect structures of each device form a metal-metal bond) the lower semiconductor device 710 to form a stack 750 of semiconductor devices. The stack 750 of semiconductor devices can at this stage be removed from the carrier wafer 700, as is illustrated in FIG. 8, leaving an assembly in which the stack has an exterior surface of an outermost semiconductor device (the lower semiconductor device 710 in FIG. 8) on which are formed one or more regions of the hydrophobic material 717, surrounded by a layer 711 of dielectric material, and electrically isolated from any circuits of the assembly.

Figure 9:
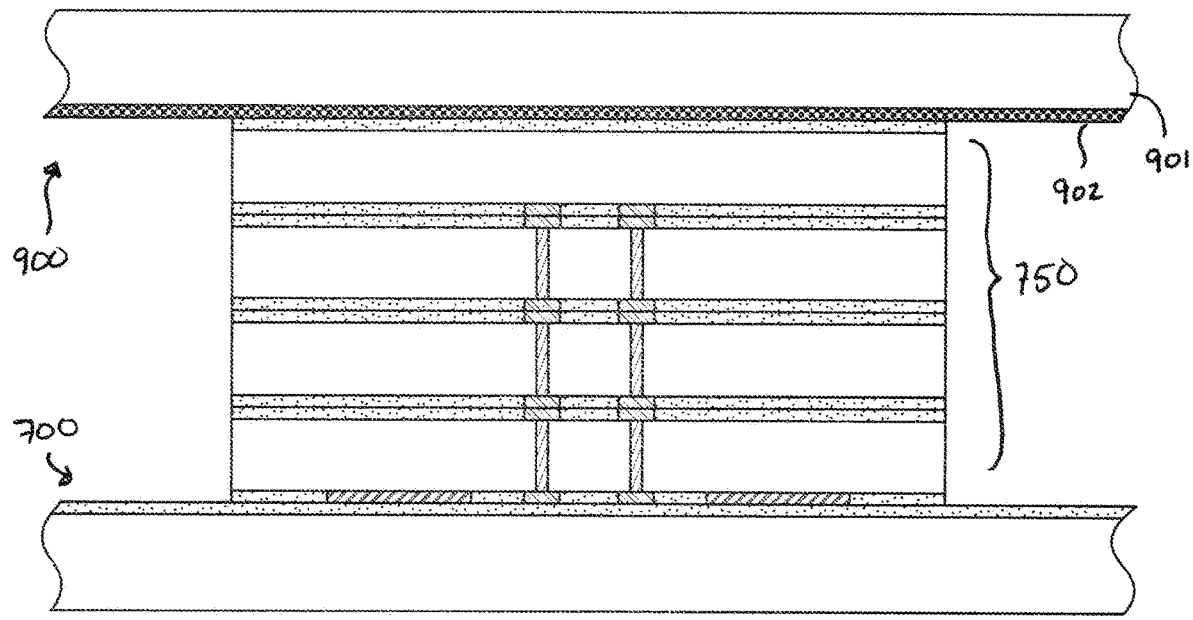
Figure 10:
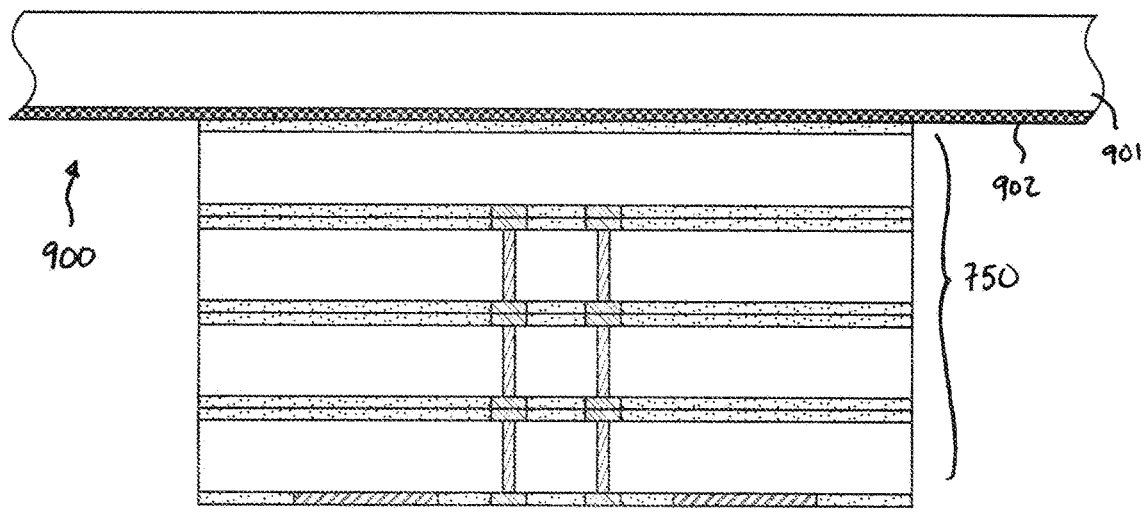
Figure 11:
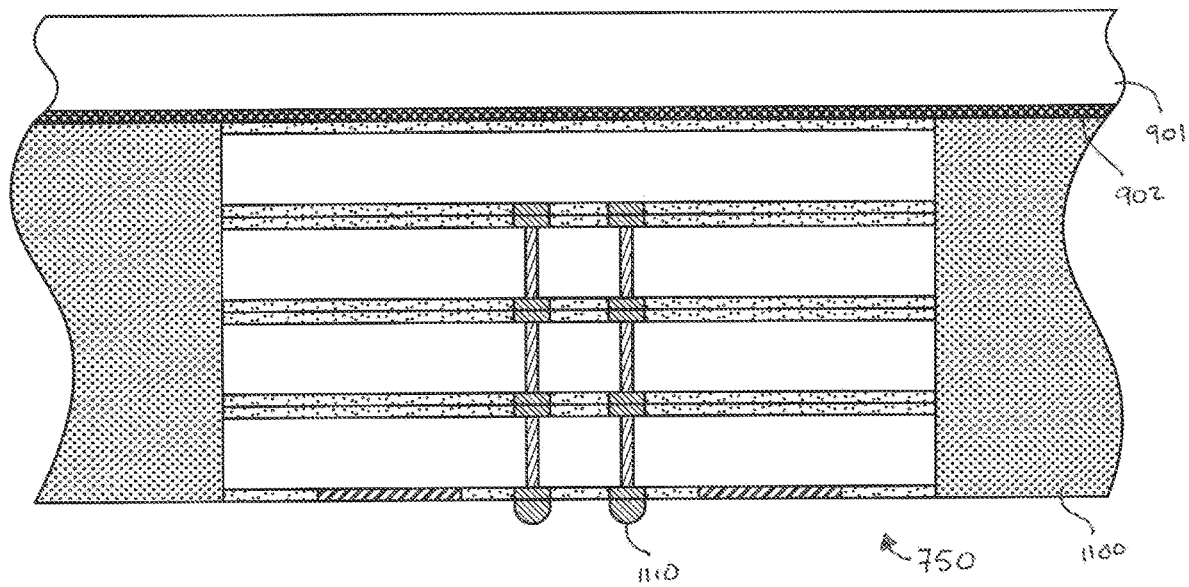
Figure 12:
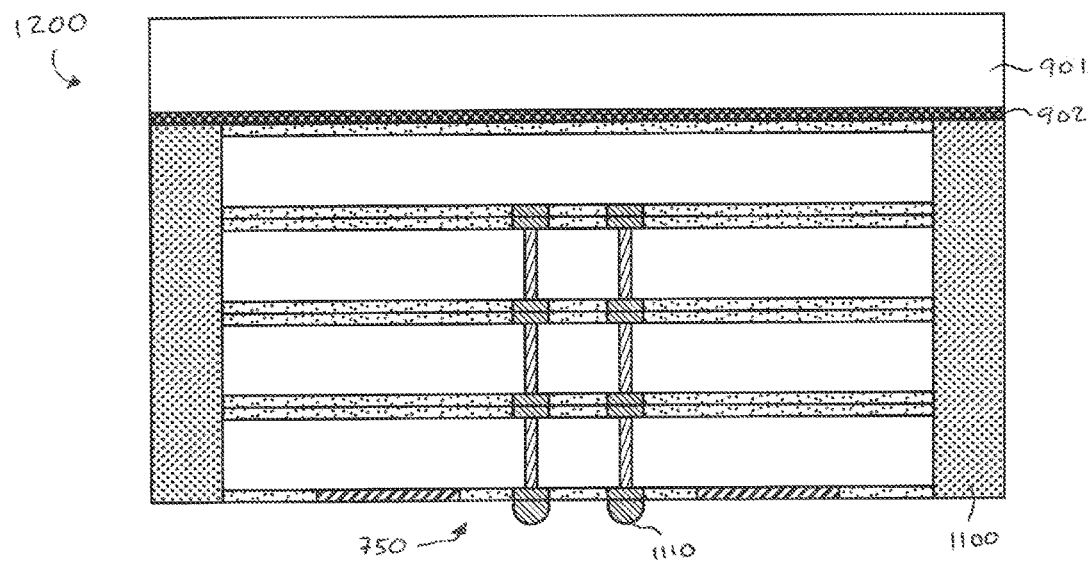
Figure 13:
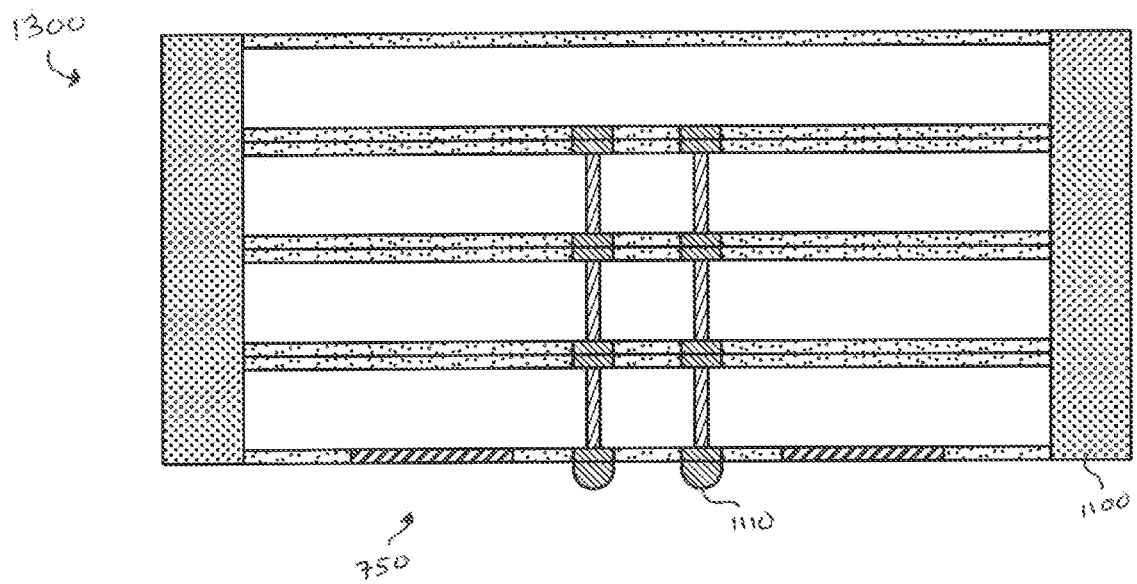

Alternatively, rather than removing the stack 750 as shown in FIG. 8, in another embodiment of the disclosure, the stack 750 can be attached to another temporary carrier wafer 900 (by a layer of adhesive 902 over the carrier substrate, as is shown in FIG. 9), and the first carrier wafer 700 can be removed to expose interconnects of the stack 750 for further processing (as shown in FIG. 10). This processing can involve the encapsulation of the stack 750 by an encapsulant material 1100 (e.g., mold resin) and the formation of solder balls 110 (as shown in FIG. 11), followed by the singulation of the assembly 1200 from other assemblies on the carrier wafer (as is shown in FIG. 12). The singulated carrier wafer materials (substrate 901 and adhesive 902) can optionally be removed, as shown in FIG. 13, to provide an assembly 1300 with a smaller vertical dimension.

Although in the foregoing examples, a second carrier wafer is described and illustrated as being attached to a semiconductor device by adhesive, in other embodiments a second carrier wafer could be bonded to a semiconductor device in a similar manner to that described above with reference to a first carrier wafer—namely by a dielectric-dielectric bond mediated by one or more regions of hydrophobic material disposed on the second carrier wafer, the semiconductor device, or both.

Figure 14:
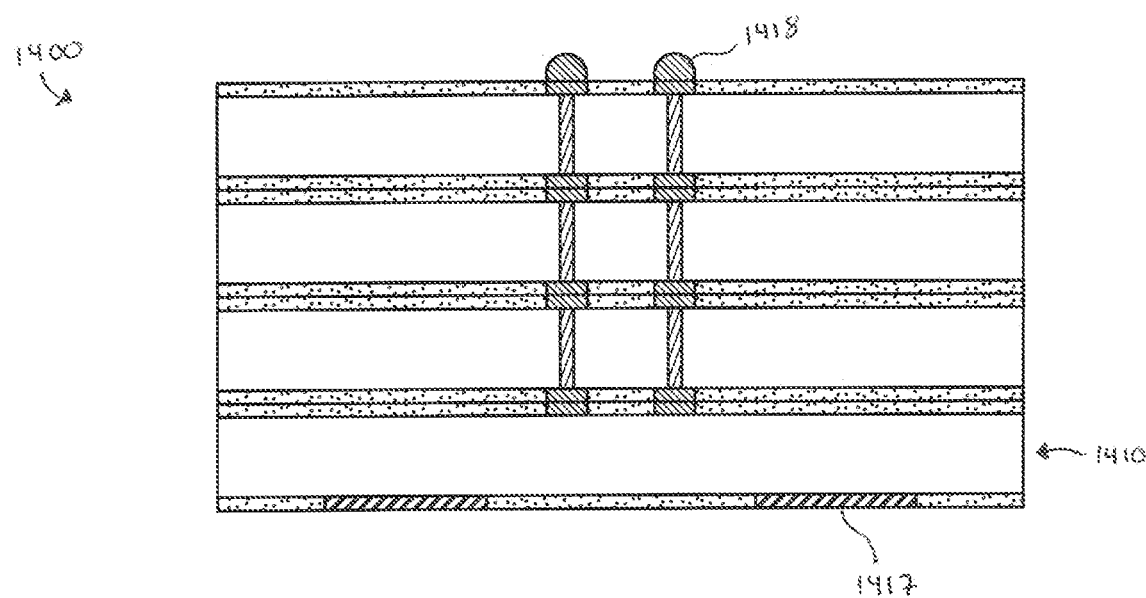

According to various aspects of the present disclosure, a semiconductor device may be bonded by a hydrophobic-material-mediated dielectric-dielectric bond either at the active surface of the semiconductor device or at the back surface of the semiconductor device. For example, FIG. 14 illustrates a semiconductor device assembly 1400 in which an outermost semiconductor device 1410 of the assembly 1400 includes one or more regions 1417 of hydrophobic material at a back surface of the semiconductor device (e.g., opposite the interconnects of the upper device in a stack which omits TSVs).

Although in the foregoing example embodiments, regions of hydrophobic material formed on an exterior surface of a semiconductor device are described as being electrically isolated from any circuits in the semiconductor device, in other embodiments of the present disclosure regions can be optionally connected to circuitry, such as a ground plane, a power plane, or even signaling circuits.

Although in the foregoing examples, semiconductor device assemblies have been illustrated and described as including an outermost semiconductor device with an exterior surface on which are formed one or more regions of the hydrophobic material, surrounded by a layer of dielectric material, and electrically isolated from any circuits of the assembly, in other embodiments in which regions of hydrophobic material are provided only on a carrier wafer (e.g., carrier wafer 200 in FIG. 2), a semiconductor device assembly may instead include an outermost semiconductor device with an exterior surface having a layer of dielectric material with one or more mechanically-altered regions corresponding to the locations of the hydrophobic material on the carrier wafer to which the outermost semiconductor device was attached. In this regard, the mechanical alteration in these regions of the dielectric material may include different levels of surface roughness when compared to portions of the dielectric material outside of the mechanically-altered regions (e.g., having an Ra and/or a Rms value of more than 10% greater or lesser than, or more than 25% greater or lesser than, or more than 50% greater or lesser than the portions outside of the mechanically-altered regions).

Figure 15:
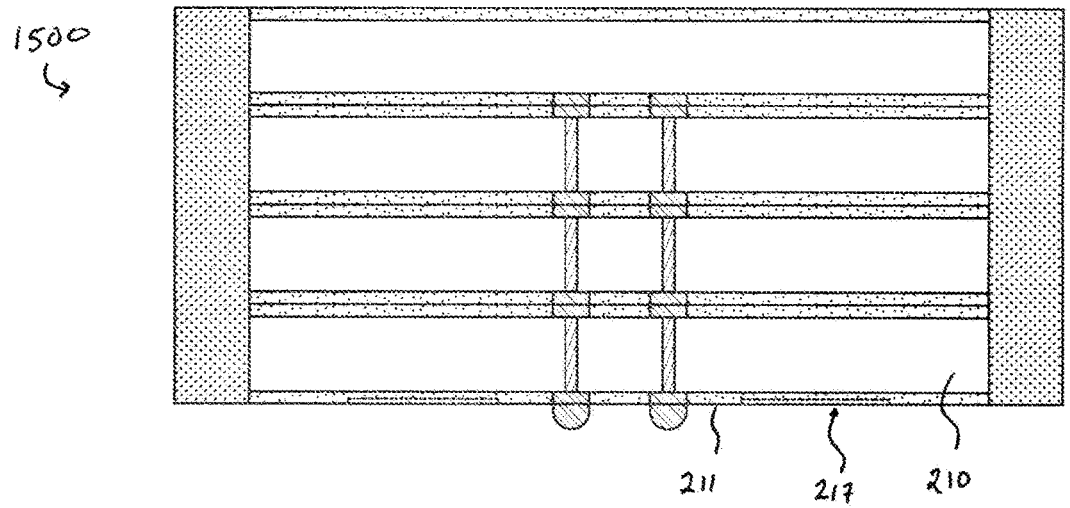

For example, FIG. 15 illustrates a partial schematic cross-sectional view of a semiconductor device assembly 1500 in which an outermost semiconductor device 210 of the assembly 1500 includes one or more mechanically-altered regions 217 of dielectric material 211 at an outer surface of the semiconductor device. The mechanically-altered regions correspond to the regular polygonal or curvilinear shapes of the hydrophobic regions of the carrier wafer (e.g., carrier wafer 200 in FIG. 2), and may have clearly-defined boundaries (e.g., where the Ra and/or Rms vary rapidly from one value to another over short distances on the order of 1 to 50 µm).

Figure 16:
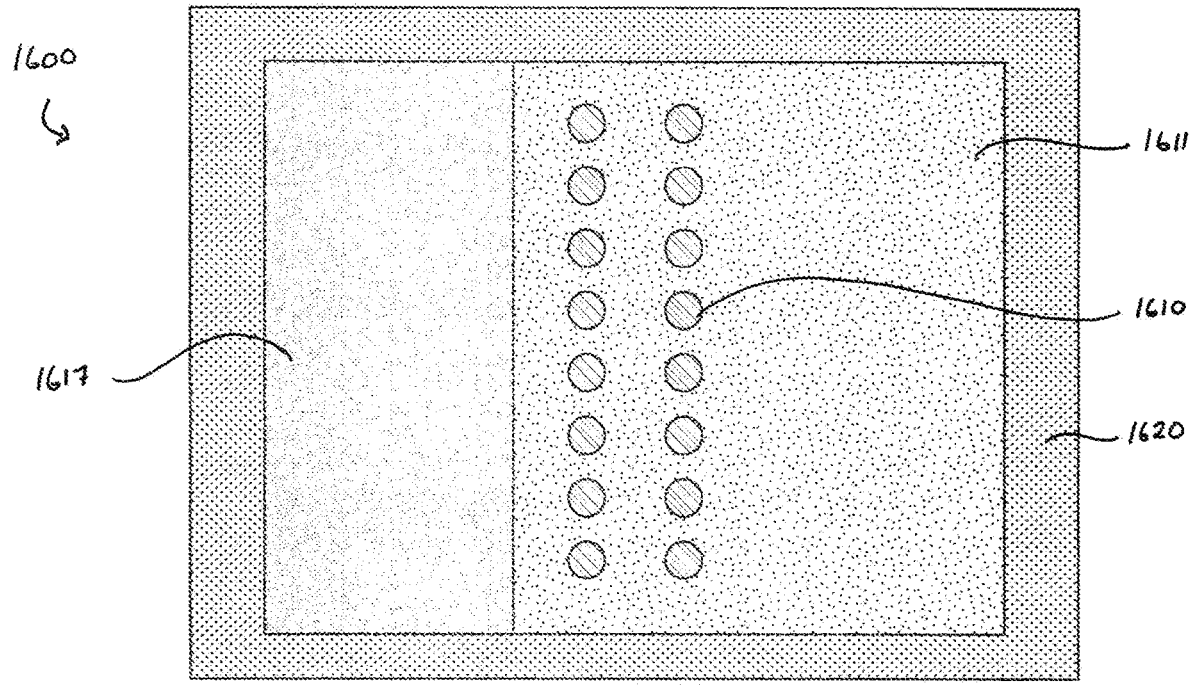
FIG. 16 is a simplified schematic plan view of a semiconductor device assembly in accordance with embodiments of the present technology.

Although the mechanically-altered regions of semiconductor device assembly 1500 are illustrated as laterally-spaced apart from interconnect structures and surrounded by portions of dielectric material 211 that are not mechanically-altered, in other embodiments of the present disclosure other arrangements of mechanically-altered regions with other positions, shapes, sizes, and spatial relationships to interconnects and die edges may be implemented. For example, FIG. 16 illustrates a partial schematic plan view of a semiconductor device assembly 1600 in which the surface of a lowermost die in a stack includes a dielectric layer 611 with a single, large mechanically-altered region 1617 that extends to three of the four side surfaces of the bottommost die. Such an arrangement may correspond to a carrier wafer in which hydrophobic regions overlap the edge of the semiconductor device stacked thereof to facilitate easy debonding from one side edge thereof (e.g., analogous to semiconductor device 410 in FIG. 4). In still other embodiments, one or more mechanically-altered regions may be located in an outer surface of a top-most semiconductor device in a stack (analogous to semiconductor device assembly 1400), surrounding one or more interconnects on the surface of the device, extending to different numbers of sidewalls, and/or provided with other shapes (regular or irregular polygons or curvilinear shapes).

In accordance with one aspect of the present disclosure, the semiconductor devices illustrated in the assemblies of FIGS. 1-16 could be memory dies, such as dynamic random access memory (DRAM) dies, NOT-AND (NAND) memory dies, NOT-OR (NOR) memory dies, magnetic random access memory (MRAM) dies, phase change memory (PCM) dies, ferroelectric random access memory (FeRAM) dies, static random access memory (SRAM) dies, or the like. In an embodiment in which multiple dies are provided in a single assembly, the semiconductor devices could be memory dies of a same kind (e.g., both NAND, both DRAM, etc.) or memory dies of different kinds (e.g., one DRAM and one NAND, etc.). In accordance with another aspect of the present disclosure, the semiconductor dies of the assemblies illustrated and described above could be logic dies (e.g., controller dies, processor dies, etc.), or a mix of logic and memory dies (e.g., a memory controller die and a memory die controlled thereby).

Figure 17:
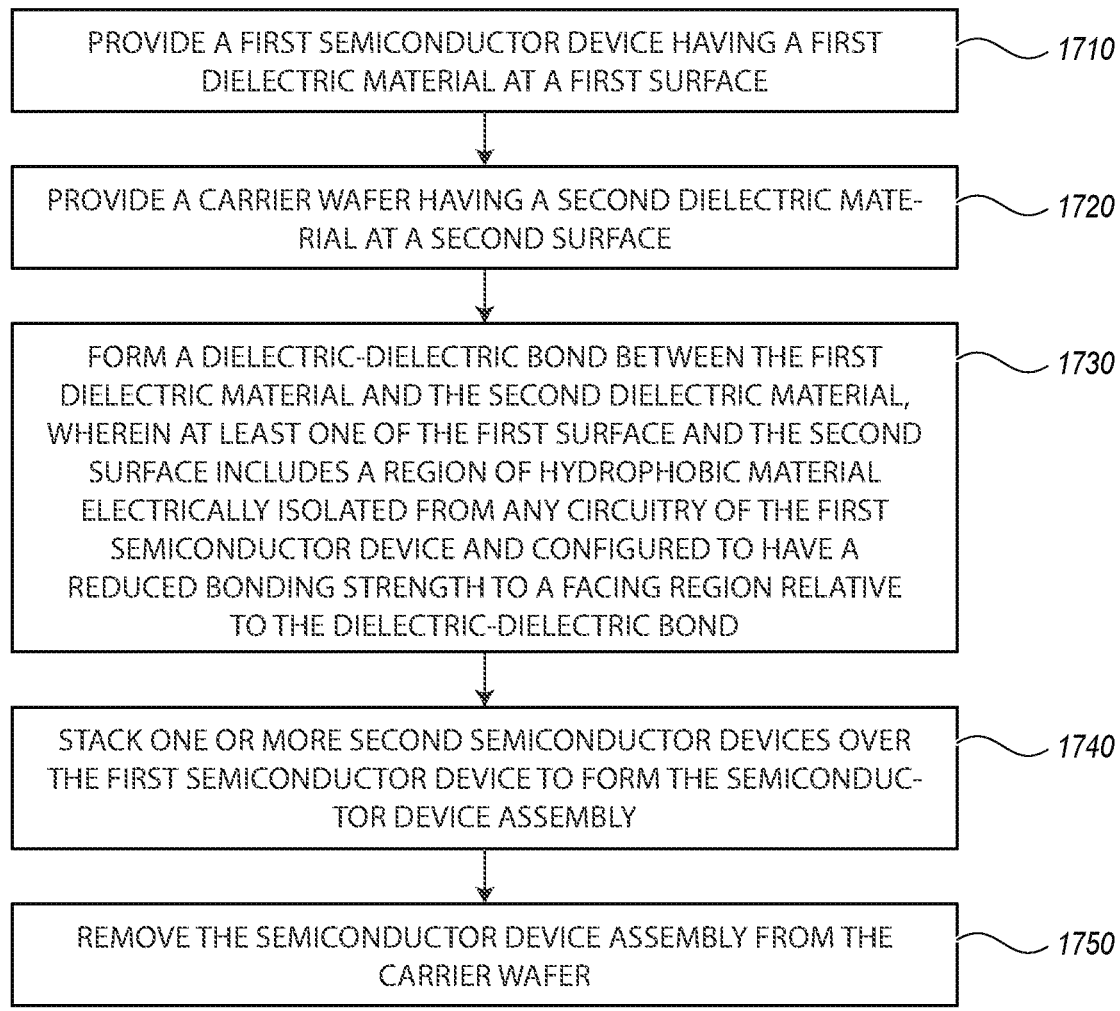
FIGS. 17 and 18 are flow charts illustrating a method of making semiconductor devices and device assemblies in accordance with an embodiment of the present technology.

FIG. 17 is a flow chart illustrating a method of making a semiconductor device assembly. The method includes providing a first semiconductor device having a first dielectric material at a first surface (box 1710) and providing a carrier wafer having a second dielectric material at a second surface (box 1720). The method further includes forming a dielectric-dielectric bond between the first dielectric material and the second dielectric material, wherein at least one of the first surface and the second surface includes a region of hydrophobic material electrically isolated from any circuitry of the first semiconductor device and configured to have a reduced bonding strength to a facing region relative to the dielectric-dielectric bond (box 1730). The method further includes stacking one or more second semiconductor devices over the first semiconductor device to form the semiconductor device assembly (box 1740) and removing the semiconductor device assembly from the carrier wafer (box 1750).

Figure 18:
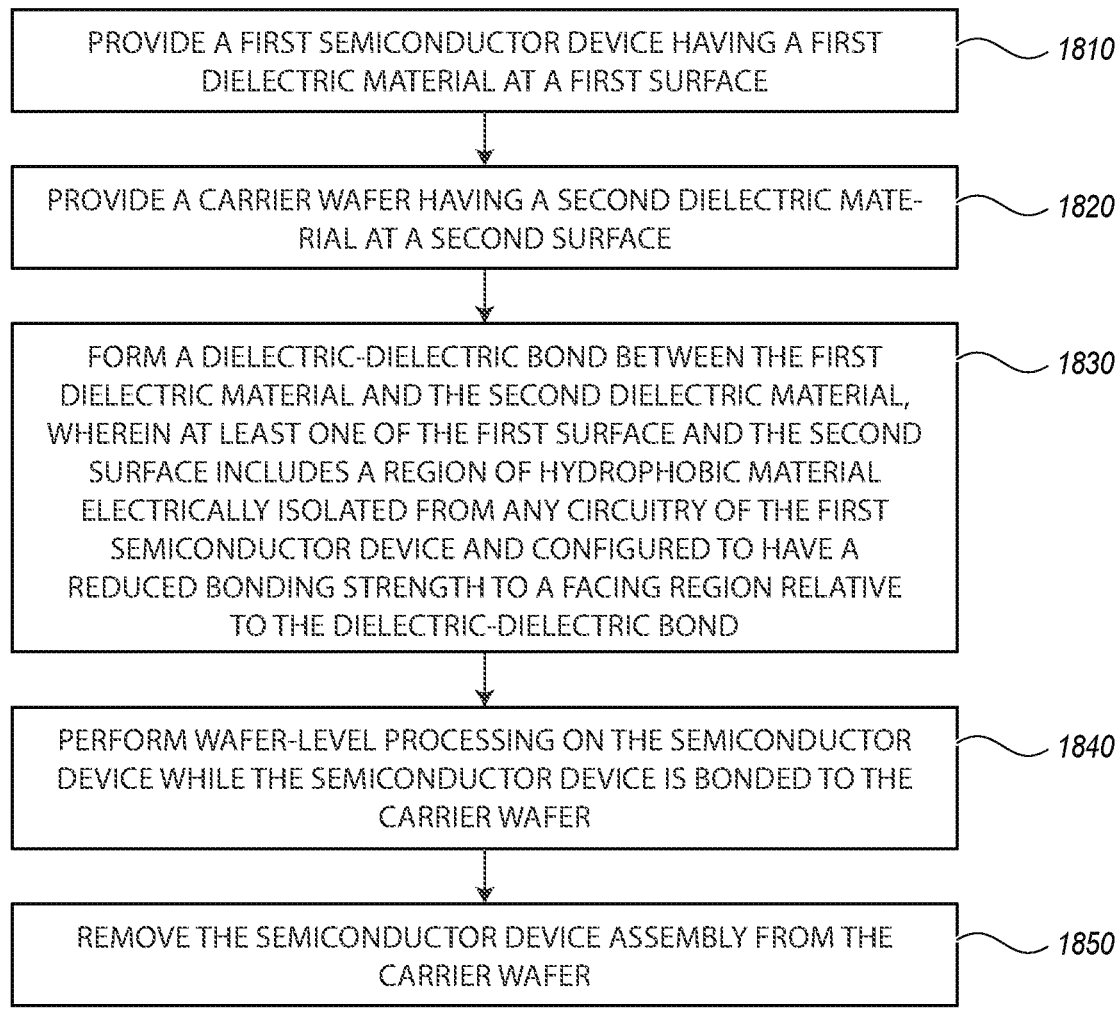

FIG. 18 is a flow chart illustrating a method of making a semiconductor device assembly. The method includes providing a semiconductor device having a first dielectric material at a first surface (box 1810) and providing a carrier wafer having a second dielectric material at a second surface (box 1820). The method further includes forming a dielectric-dielectric bond between the first dielectric material and the second dielectric material, wherein at least one of the first surface and the second surface includes a region of hydrophobic material electrically isolated from any circuitry of the semiconductor device and configured to have a reduced bonding strength to a facing region relative to the dielectric-dielectric bond (box 1830). The method further includes performing wafer-level processing on the semiconductor device while the semiconductor device is bonded to the carrier wafer (box 1840) and removing the semiconductor device assembly from the carrier wafer (box 1850).

Figure 19:
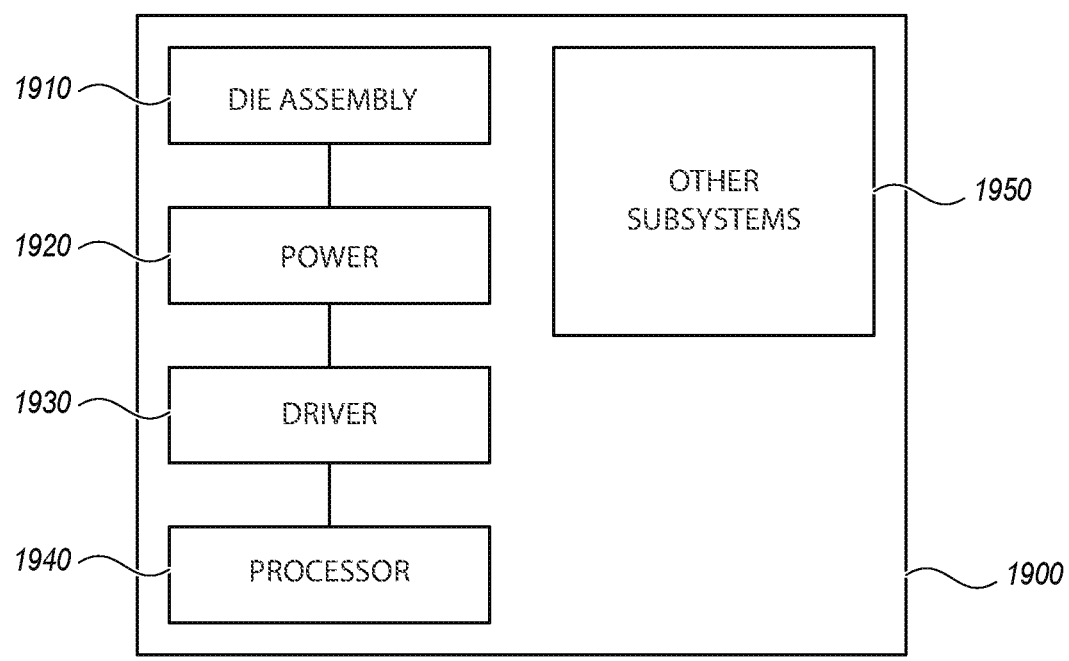
FIG. 19 is a schematic view showing a system that includes a semiconductor device assembly configured in accordance with an embodiment of the present technology.

Any one of the semiconductor devices and semiconductor device assemblies described above with reference to FIGS. 1-18 can be incorporated into any of a myriad of larger and/or more complex systems, a representative example of which is system 1900 shown schematically in FIG. 19. The system 1900 can include a semiconductor device assembly (e.g., or a discrete semiconductor device) 1902, a power source 1904, a driver 1906, a processor 1908, and/or other subsystems or components 1910. The semiconductor device assembly 1902 can include features generally similar to those of the semiconductor devices described above with reference to FIGS. 1-16. The resulting system 1900 can perform any of a wide variety of functions, such as memory storage, data processing, and/or other suitable functions. Accordingly, representative systems 1900 can include, without limitation, hand-held devices (e.g., mobile phones, tablets, digital readers, and digital audio players), computers, vehicles, appliances and other products. Components of the system 1900 may be housed in a single unit or distributed over multiple, interconnected units (e.g., through a communications network). The components of the system 1900 can also include remote devices and any of a wide variety of computer readable media.

Specific details of several embodiments of semiconductor devices, and associated systems and methods, are described above. A person skilled in the relevant art will recognize that suitable stages of the methods described herein can be performed at the wafer level or at the die level. Therefore, depending upon the context in which it is used, the term "substrate" can refer to a wafer-level substrate or to a singulated, die-level substrate. Furthermore, unless the context indicates otherwise, structures disclosed herein can be formed using conventional semiconductor-manufacturing techniques. Materials can be deposited, for example, using chemical vapor deposition, physical vapor deposition, atomic layer deposition, plating, electroless plating, spin coating, and/or other suitable techniques. Similarly, materials can be removed, for example, using plasma etching, wet etching, chemical-mechanical planarization, or other suitable techniques.

The devices discussed herein, including a memory device, may be formed on a semiconductor substrate or die, such as silicon, germanium, silicon-germanium alloy, gallium arsenide, gallium nitride, etc. In some cases, the substrate is a semiconductor wafer. In other cases, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

The functions described herein may be implemented in hardware, software executed by a processor, firmware, or any combination thereof. Other examples and implementations are within the scope of the disclosure and appended claims. Features implementing functions may also be physically located at various positions, including being distributed such that portions of functions are implemented at different physical locations.

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

As used herein, the terms "vertical," "lateral," "upper," "lower," "above," and "below" can refer to relative directions or positions of features in the semiconductor devices in view of the orientation shown in the Figures. For example, "upper" or "uppermost" can refer to a feature positioned closer to the top of a page than another feature. These terms, however, should be construed broadly to include semiconductor devices having other orientations, such as inverted or inclined orientations where top/bottom, over/under, above/below, up/down, and left/right can be interchanged depending on the orientation.

It should be noted that the methods described above describe possible implementations, and that the operations and the steps may be rearranged or otherwise modified and that other implementations are possible. Furthermore, embodiments from two or more of the methods may be combined.

From the foregoing, it will be appreciated that specific embodiments of the invention have been described herein for purposes of illustration, but that various modifications may be made without deviating from the scope of the invention. Rather, in the foregoing description, numerous specific details are discussed to provide a thorough and enabling description for embodiments of the present technology. One skilled in the relevant art, however, will recognize that the disclosure can be practiced without one or more of the specific details. In other instances, well-known structures or operations often associated with memory systems and devices are not shown, or are not described in detail, to avoid obscuring other aspects of the technology. In general, it should be understood that various other devices, systems, and methods in addition to those specific embodiments disclosed herein may be within the scope of the present technology.

What is claimed is:

1. A method of making a semiconductor device assembly, the method comprising:
    providing a first semiconductor device having a first dielectric material at a first surface;
    providing a carrier wafer having a second dielectric material at a second surface;
    forming a dielectric-dielectric bond between the first dielectric material and the second dielectric material, wherein at least one of the first surface and the second surface includes a region of hydrophobic material electrically isolated from any circuitry of the first semiconductor device and configured to have a reduced bonding strength to a region contacting the region of hydrophobic material on an opposite side of the dielectric-dielectric bond;
    stacking one or more second semiconductor devices over the first semiconductor device to form the semiconductor device assembly; and
    removing the semiconductor device assembly from the carrier wafer.

2. The method of claim 1, wherein the first surface is an active surface of the first semiconductor device that further includes metal interconnects.

3. The method of claim 1, wherein the region of hydrophobic material extends at least to a sidewall of the first semiconductor device.

4. The method of claim 1, wherein the first surface includes the region of hydrophobic material.

5. The method of claim 1, wherein the second surface includes the region of hydrophobic material.

6. The method of claim 1, wherein the region of hydrophobic material overlaps at least 25% of a footprint of the first semiconductor device.

7. The method of claim 1, wherein the region contacting the region of hydrophobic material comprises either the first dielectric material or the second dielectric material.

8. The method of claim 1, wherein the region contacting the region of hydrophobic material comprises at least one metal interconnect structure of the first semiconductor device.

9. The method of claim 1, wherein the region of hydrophobic material is a first region of hydrophobic material at the first surface, and wherein the second surface includes the region contacting the region of hydrophobic material, and wherein the region contacting the region of hydrophobic material includes a second region of hydrophobic material.

10. The method of claim 1, wherein the region of hydrophobic material is a first region of hydrophobic material at the first surface, and wherein the first surface includes a second region of hydrophobic material laterally spaced from the first region.

11. The method of claim 1, wherein the hydrophobic material comprises at least one of Cu, Al, or Au, or a combination thereof.

12. A method of processing a semiconductor device, the method comprising:
    providing a semiconductor device having a first dielectric material at a first surface;
    providing a carrier wafer having a second dielectric material at a second surface;
    forming a dielectric-dielectric bond between the first dielectric material and the second dielectric material, wherein at least one of the first surface and the second surface includes a region of hydrophobic material electrically isolated from any circuitry of the semiconductor device and configured to have a reduced bonding strength to a region contacting the region of hydrophobic material on an opposite side of the dielectric-dielectric bond;
    performing wafer-level processing on the semiconductor device while the semiconductor device is bonded to the carrier wafer; and
    removing the semiconductor device assembly from the carrier wafer.

13. The method of claim 12, wherein the hydrophobic material comprises at least one of Cu, Al, or Au, or a combination thereof.

\* \* \* \* \*